(12) United States Patent
Hlavenka et al.

(10) Patent No.: US 12,633,496 B2
(45) Date of Patent: May 19, 2026

(54) SHIELDED DETECTOR FOR CHARGED PARTICLE MICROSCOPY

(71) Applicant: FEI Company, Hillsboro, OR (US)

(72) Inventors: Petr Hlavenka, Brno (CZ); Eva Šťastná, Šardice (CZ); Vojtěch Mahel, Boršice u Blatnice (CZ); Jakub Klus, Nový Jičín (CZ); Branislav Straka, Brno (CZ)

(73) Assignee: FEI Company, Hillsboro, OR (US)

( * ) Notice: Subject to any disclaimer, the term of this patent is extended or adjusted under 35 U.S.C. 154(b) by 333 days.

(21) Appl. No.: 18/456,048

(22) Filed: Aug. 25, 2023

(65) Prior Publication Data

US 2025/0069844 A1    Feb. 27, 2025

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/026* (2013.01)

(58) Field of Classification Search
CPC .... H01J 37/244; H01J 37/28; H01J 2237/026; H01J 2237/0213; H01J 2237/024; H01J 2237/2442; H01J 2237/28; H01J 37/261; G01N 23/20091
See application file for complete search history.

(56) References Cited

U.S. PATENT DOCUMENTS

| | | | | | |
|---|---|---|---|---|---|
| 5,149,968 | A * | 9/1992 | Sato | ........................ | H01J 37/09 |
| | | | | | 250/397 |
| 7,723,684 | B1 * | 5/2010 | Haddon | .................... | G01J 5/12 |
| | | | | | 250/338.1 |
| 7,858,185 | B2 * | 12/2010 | Sen | ........................ | B82Y 10/00 |
| | | | | | 428/408 |
| 8,147,722 | B2 * | 4/2012 | Sen | ........................ | C01B 32/17 |
| | | | | | 252/502 |
| 10,068,746 | B2 * | 9/2018 | Koo | ........................ | H01J 37/28 |
| 11,092,886 | B2 | 8/2021 | Timmermans et al. | | |
| 12,261,016 | B1 * | 3/2025 | Yin | ........................ | H01J 37/28 |

(Continued)

FOREIGN PATENT DOCUMENTS

| | | | | | |
|---|---|---|---|---|---|
| CA | | 3088378 | A1 * | 1/2019 | .......... A61B 6/5217 |
| WO | WO-2007096635 | A1 * | 8/2007 | .......... G01N 27/127 |

OTHER PUBLICATIONS

Barbera M., et al., "Carbon Nanotubes Thin Filters for X-Ray Detectors in Space," Proceedings of the SPIE, Aug. 31, 2022, vol. 12181, XP060164436, 17 pages.

(Continued)

*Primary Examiner* — David A Vanore

(74) *Attorney, Agent, or Firm* — Leron Vandsburger

(57) ABSTRACT

Systems, components, and methods for detecting characteristic signals are described. A detector includes a detector cell. The detector cell can be configured to generate an electrical signal in response to a particle incident on an active layer of the detector cell, The active layer can define an absorption surface. The detector can include a filter. The filter can include a membrane of carbon material. The filter can be disposed relative to the detector cell to shield the absorption surface from a subset of the incident particles. The subset of the incident particles can include electrons, ions, and photons. The photons can have an energy less than about 40 eV.

17 Claims, 7 Drawing Sheets

(56) References Cited

U.S. PATENT DOCUMENTS

| | | | |
|---|---|---|---|
| 2008/0260225 A1* | 10/2008 | Szu ........................... | G01J 3/36 |
| | | | 382/128 |
| 2017/0031037 A1* | 2/2017 | MacLaughlin ....... | G01T 1/2002 |
| 2017/0294247 A1* | 10/2017 | MacLaughlin ........... | G01T 7/00 |
| 2018/0329291 A1* | 11/2018 | Timmermans ............ | G03F 1/64 |
| 2025/0069844 A1* | 2/2025 | Hlavenka .............. | H01J 37/244 |

OTHER PUBLICATIONS

EP24194040.2, Partial European Search Report, Jan. 31, 2025, 16 pages.
Research Disclosure, "Carbon Based Windows for Filtering Infra-red Radiation," Mar. 1, 2022, vol. 696, No. 82, XP007150183, 3 pages, Retrieved from the Internet URL: https://www.researchdisclosure.com/database/RD696082.
Wilson A.R., et al., "Backscattered Electron Effects in a High-Angle EDXS," Journal of Physics E: Scientific Instruments, Sep. 1, 1989, vol. 22, No. 9, XP020019075, pp. 726-729.

* cited by examiner

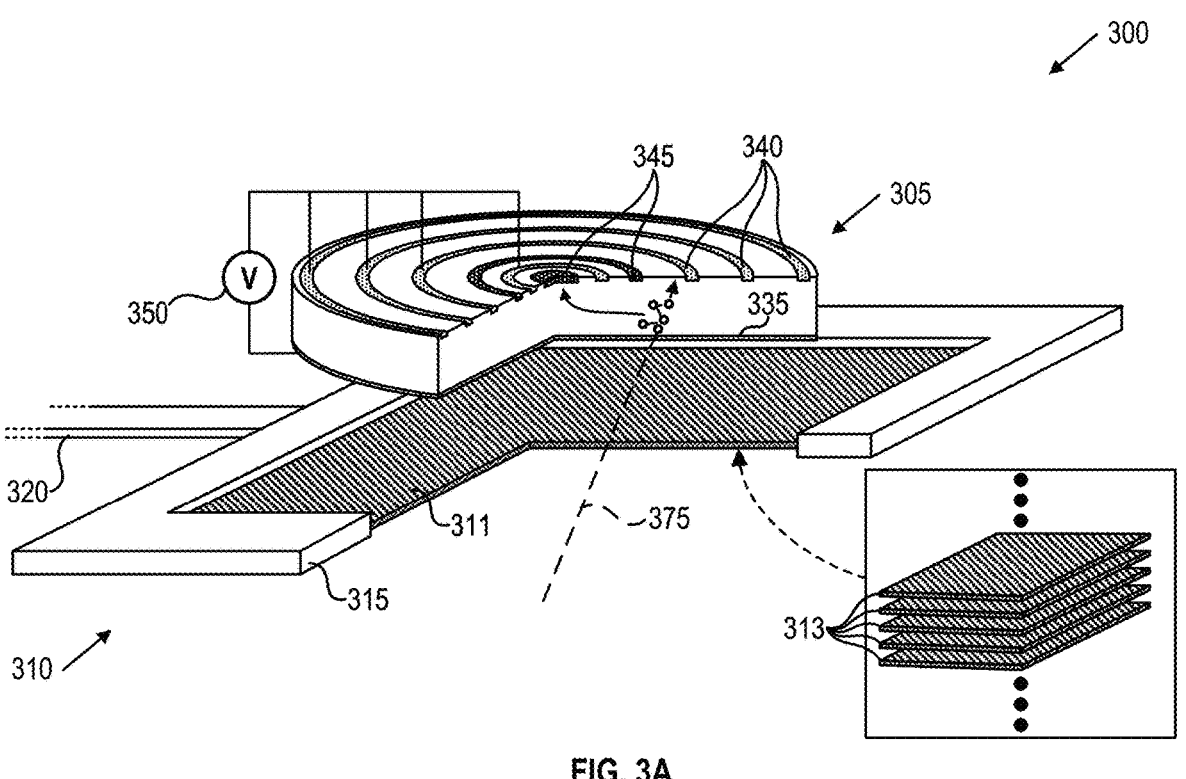
FIG. 3A
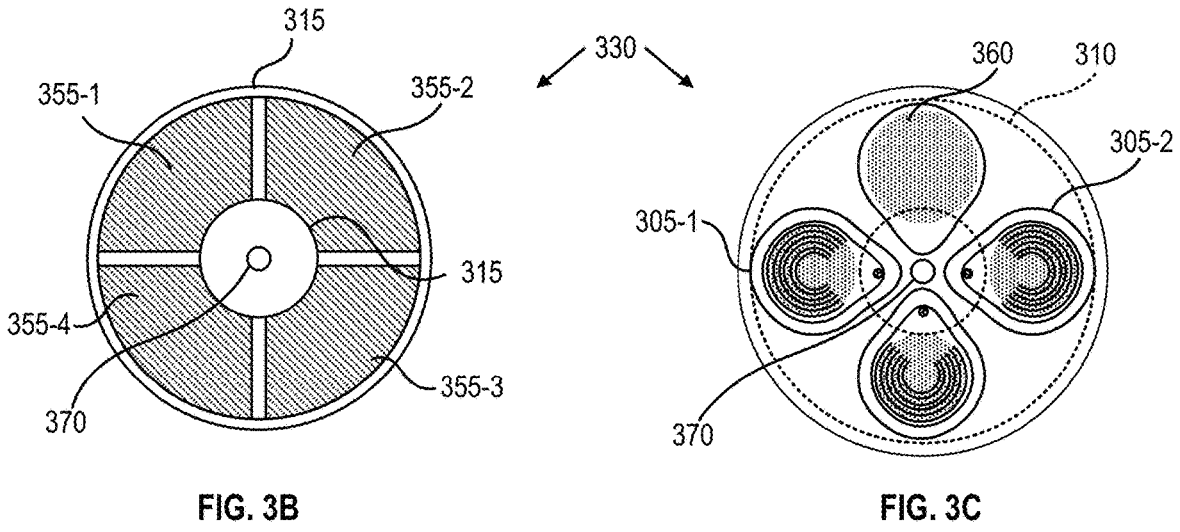
FIG. 3B     FIG. 3C

SHIELDED DETECTOR FOR CHARGED PARTICLE MICROSCOPY

TECHNICAL FIELD

Embodiments of the present disclosure are directed to charged particle microscopy systems, components, and methods for their operation. Some embodiments are directed toward components configured for detection of x-rays.

BACKGROUND

In charged particle microscopy, characteristic x-rays are produced by excitation of inner-shell electrons as the beam interacts with atoms of a sample. X-ray signals are commonly used for elemental analysis in scanning electron microscope (SEM) systems. For example, x-ray signals can be used to generate energy dispersive x-ray (EDS) spectra, from which elemental composition of a sample can be measured.

Conventional EDS detectors are built around a detector cell. The detector cell absorbs an incident x-ray of a given energy and generates a proportional charge that is detected. Inner shell excitation and subsequent x-ray emission can occur on various surfaces in the SEM, for example, as a result of secondary phenomena other than direct interrogation of a sample. To that end, typical x-ray EDS detectors incorporate a collimator assembly that blocks X-rays originating from outside the area being excited by the electron beam. In effect, the collimator reduces the number of stray X-rays from other parts of the microscope chamber that are included in the analysis, but also limits the solid collection angle of the EDS detector significantly.

Conventional detectors are sensitive to incident particles of diverse types. Ions, electrons, photons in the ultraviolet, visible, and/or infrared spectral ranges, and other forms of radiation, can give rise to noise in EDS data. Such noise can obscure signals attributable to low-energy x-rays and/or low intensity x-ray lines. To that end, typical x-ray EDS detectors include a window between the detector and the vacuum chamber. There are two main types of window materials: beryllium (Be) windows that strongly absorbs low energy X-rays meaning that only sodium (Na) or heavier elements can be detected; and polymer-based windows that, while allowing detection of X-rays down to 100 eV, are far less robust than Be windows and are radiation sensitive (polymer windows can be degraded by electrons, ions, and photons). Polymer windows are typically supported by grids or other structures for structural reinforcement, but such grids also introduce artefacts into EDS data.

In another example, EDS detectors typically include a device to divert electrons away from the detector that can otherwise cause background noise and can overload detector electronics. The electron diversion device is typically a permanent magnet that strongly deflects any passing electrons. Such devices are typically included in detectors using polymer windows, as thicker beryllium windows absorb electrons below 20 keV in energy. The permanent magnet, however, interferes with beam properties in close proximity with the primary beam. For this reason, typical EDS detectors are oriented relative to a sample at a takeoff angle from about 35 degrees to about 50 degrees and at a relatively large distance from the sample, compared to pole piece-mounted detectors.

As a result of the engineering constraints described above, EDS detectors are typically limited by solid angle of collection, relatively low takeoff angle, insensitivity to low-energy x-ray lines that are difficult to distinguish from background noise, susceptibility to noise generated by extraneous signals, and sensitivity to degradation by energetic species. There is a need, therefore, for improved EDS detectors exhibiting improved solid angle of collection, improved takeoff angle, and improved sensitivity to x-rays relative to noise sources (e.g., electrons, ions, and photons).

SUMMARY

In a first aspect, a detector includes a detector cell. The detector cell can be configured to generate an electrical signal in response to a particle incident on an active layer of the detector cell, The active layer can define an absorption surface. The detector can include a filter. The filter can include a membrane of carbon material. The filter can be disposed relative to the detector cell to shield the absorption surface from a subset of the incident particles. The subset of the incident particles can include electrons, ions, and photons. The photons can have an energy less than about 40 eV.

In some embodiments, the carbon material can include carbon nanotubes. The carbon material can include a layer of nonwoven carbon nanotube felt. The membrane can include multiple substantially planar layers of carbon nanotube felt. The multiple layers can together define a spatially variant transmissivity of the filter. The filter can include a frame in which the layer is disposed. The detector can further include multiple frames including the frame. The multiple frames can be individually addressable and individually movable relative to the detector cell.

In some embodiments, the detector defines an aperture substantially parallel with the absorption surface. The detector cell and the filter can be configured to accommodate the aperture. The detector can include segments arranged about the aperture. The filter can include one or more filter sections disposed to shield one or more of the segments from the subset of incident particles. The detector can include one or more segments configured to detect x-rays and one or more segments configured to detect charged particles and/or photons. The filter can be configured to shield the segments configured to detect x-rays.

The detector can further include a shield, moveable relative to the detector cell and the filter and disposed such that the filter is between the detector and the shield. The detector can further include a retaining element. The retaining element can be configured to dispose the detector and the filter in a vacuum chamber of a charged particle microscope and to orient the detector relative to a sample stage of the charged particle microscope such that the filter is disposed between the sample stage and the detector. The detector can include a silicon drift detector.

In a second aspect, a charged particle beam system includes a vacuum chamber. The charged particle system can include a charged particle beam column, operably coupled with the vacuum chamber and configured to direct a beam of charged particles into the vacuum chamber. The charged particle system can include a sample stage, disposed in the vacuum chamber. The charged particle system can also include the detector of the preceding aspect.

In an example, the carbon material includes carbon nanotubes. The carbon material can include a layer of nonwoven carbon nanotube felt. The membrane can include multiple substantially planar layers of nonwoven carbon nanotube felt. The multiple layers can together define a spatially variant transmissivity of the filter. The charged particle beam column can define a beam axis, A. The detector can define an aperture substantially parallel with the absorption surface and substantially aligned with the beam axis. The detector and the filter can be configured to accommodate the aperture. The detector can include segments arranged about the aperture. The filter can include one or more filter sections disposed to shield one or more of the segments from the subset of incident particles. The system can further include a shield, moveable relative to the detector and the filter and disposed such that the filter is between the detector and the shield with respect to the sample stage.

In a third aspect, a method of detecting x-rays includes directing a beam of charged particles toward a sample in a system of the preceding aspects. The method includes generating detector data using the detector of the preceding aspects. Generating detector data can include applying a bias to a detector cell, such an energetic particle incident into an active layer of the detector cell can generate charge(s) that are collected at a collector region of the detector cell. In some embodiments, the method of detecting x-rays can be encoded as machine-readable instructions stored in one or more machine-readable storage media. In this way, the systems and detectors of the preceding aspects can be configured to execute the instructions, causing the systems and detectors to perform operation(s) of the method.

The terms and expressions which have been employed are used as terms of description and not of limitation, and there is no intention in the use of such terms and expressions of excluding any equivalents of the features shown and described or portions thereof, but it is recognized that various modifications are possible within the scope of the claimed subject matter. Thus, it should be understood that although the present claimed subject matter has been specifically disclosed by embodiments and optional features, modification and variation of the concepts herein disclosed can be resorted to by those skilled in the art, and that such modifications and variations are considered to be within the scope of this disclosure as defined by the appended claims.

BRIEF DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

FIG. 3A is a schematic diagram of an example detector including a silicon drift detector, in accordance with some embodiments of the present disclosure.

FIG. 3B is a schematic diagram of an example detector including multiple segments in a quadrant arrangement, in accordance with some embodiments of the present disclosure.

FIG. 3C is a schematic diagram of an example detector including multiple silicon drift detectors in a quadrant arrangement, in accordance with some embodiments of the present disclosure.

Figure 1A:
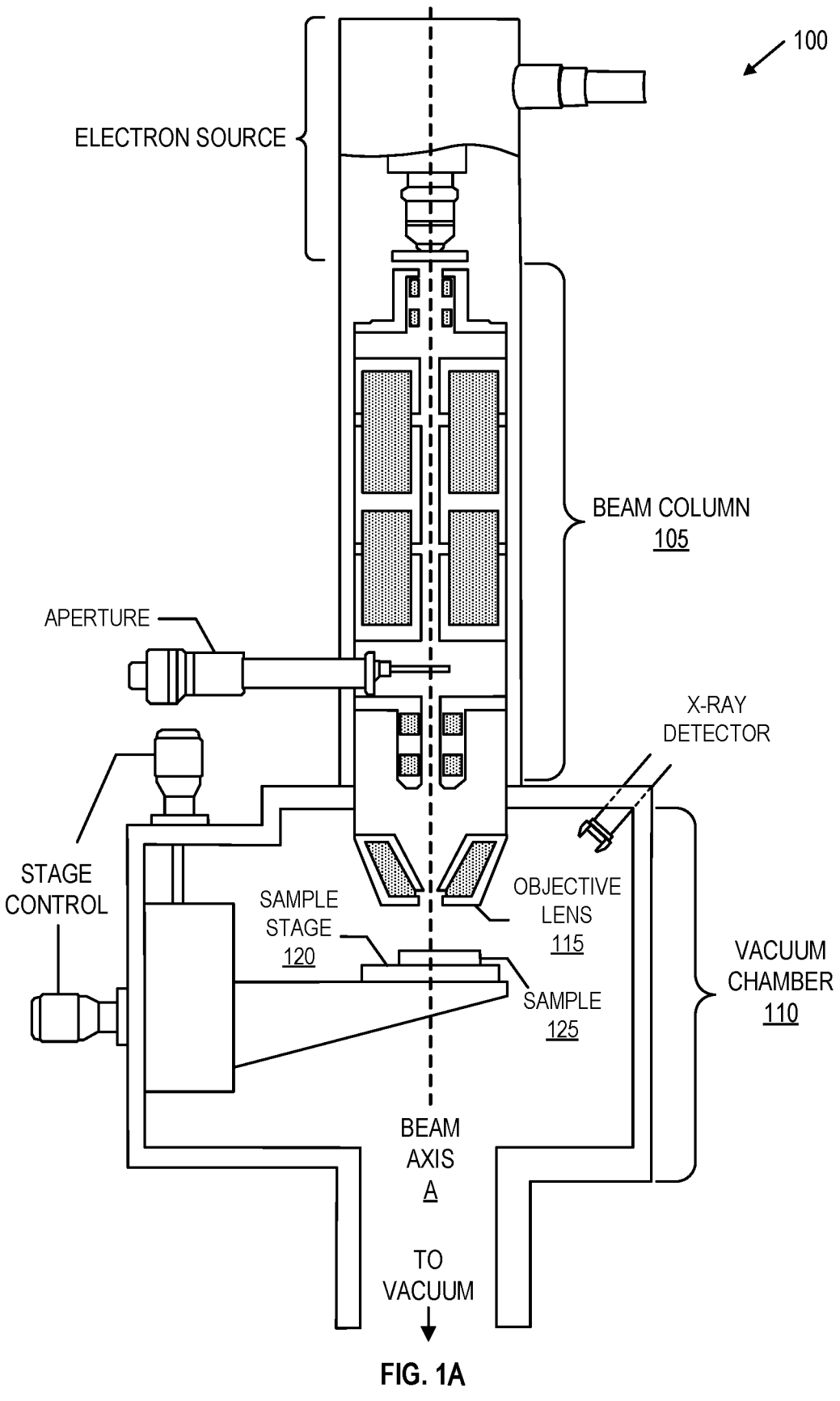
FIG. 1A is a schematic diagram illustrating an example charged particle microscope system, in accordance with some embodiments of the present disclosure.

In the drawings, like reference numerals refer to like parts throughout the various views unless otherwise specified. Not all instances of an element are necessarily labeled to reduce clutter in the drawings where appropriate. The drawings are not necessarily to scale, emphasis instead being placed upon illustrating the principles being described.

DETAILED DESCRIPTION

While illustrative embodiments have been illustrated and described, it will be appreciated that various changes can be made therein without departing from the spirit and scope of the disclosure. In the forthcoming paragraphs, embodiments of an analytical instrument system are described. Embodiments of the present disclosure focus on energy dispersive spectrometry (EDS) implemented in a scanning electron microscope in the interest of simplicity of description. To that end, embodiments are not limited to such instruments, but rather are contemplated for analytical instrument systems where analysis of characteristic x-ray signals can be limited by signal-to-noise constraints or by relatively low signal. In an illustrative example, detectors of the present disclosure can be deployed as part of charged particle systems more broadly, such as transmission electron microscopes, dual-beam systems, triple-beam systems, electron beam microanalysis systems, or the like. Similarly, while embodiments of the present disclosure focus on x-rays resulting from inner shell excitation, additional and/or alternative x-ray signals are contemplated, including but not limited to continuum x-rays, and/or fluorescence x-rays.

Embodiments of the present disclosure include systems, components, and methods for for improved x-ray detectors. In an illustrative example, a system can include a detector, configured to generate an electrical signal in response to a particle incident on an active layer of the detector, the active layer defining an absorption surface. The system can also include a filter, including a membrane of carbonaceous material, the filter being disposed relative to the detector to shield the absorption surface from a subset of the incident particles, the subset including electrons, ions, and photons, the photons having an energy less than about 40 eV. Systems, components, and methods of the present disclosure benefit from improved solid collection angle, higher takeoff angle, thereby improving signal-to-noise characteristics, reducing collection time, and reducing electron dose to preserve dose-sensitive samples. Additionally, embodiments of the present disclosure exhibit improved sensitivity to relatively low energy particles (e.g., x-rays), improved sensitivity to relatively low intensity signals, and improved robustness to degradation by energetic species.

The following detailed description focuses on embodiments of charged particle microscope systems, but it is contemplated that additional and/or alternative instrument systems can be improved through the use of the techniques and systems described. In an illustrative example, instrument systems can include analytical instruments configured to generate detector data based at least in part on interactions of a material sample with a beam of energetic species, such as ions, electrons, and/or photons. Without being bound to a particular physical formulation, in the context of the present disclosure a "particle" refers to species generated by such interactions, whether massive or not, including but not limited to charged particles (e.g., ions and electrons) and photons (e.g., microwave, IR, visible, UV, x-ray, etc.).

FIG. 1A is a schematic diagram illustrating an example charged particle microscope 100 system, in accordance with some embodiments of the present disclosure. Example charged particle microscope 100 includes multiple sections including an electron source, a beam column 105, and a vacuum chamber 110. The electron source includes high-voltage supply components, vacuum system components, and an electron emitter configured to generate a beam of electrons that is accelerated into the beam column 105. The beam column 105, in turn, includes electromagnetic lens elements that are configured to shape and form the beam of electrons from the electron source into a substantially circular beam with a substantially uniform profile transverse to a beam axis A, and conditions the beam to be focused onto a sample 125 by an objective lens 115, as described in more detail in reference to FIG. 1B.

The beam of electrons is typically characterized by a beam current and an accelerating voltage applied to generate the beam, among other criteria. The ranges of beam current and accelerating voltage can vary between instruments and are typically selected based on material properties of the sample or the type of analysis being conducted. Generally, however, beams of electrons are characterized by an energy from about 0.1 keV (e.g., for an accelerating voltage of 0.1 kV) to about 50 keV and a beam current from picoamperes to microamperes.

Figure 1B:
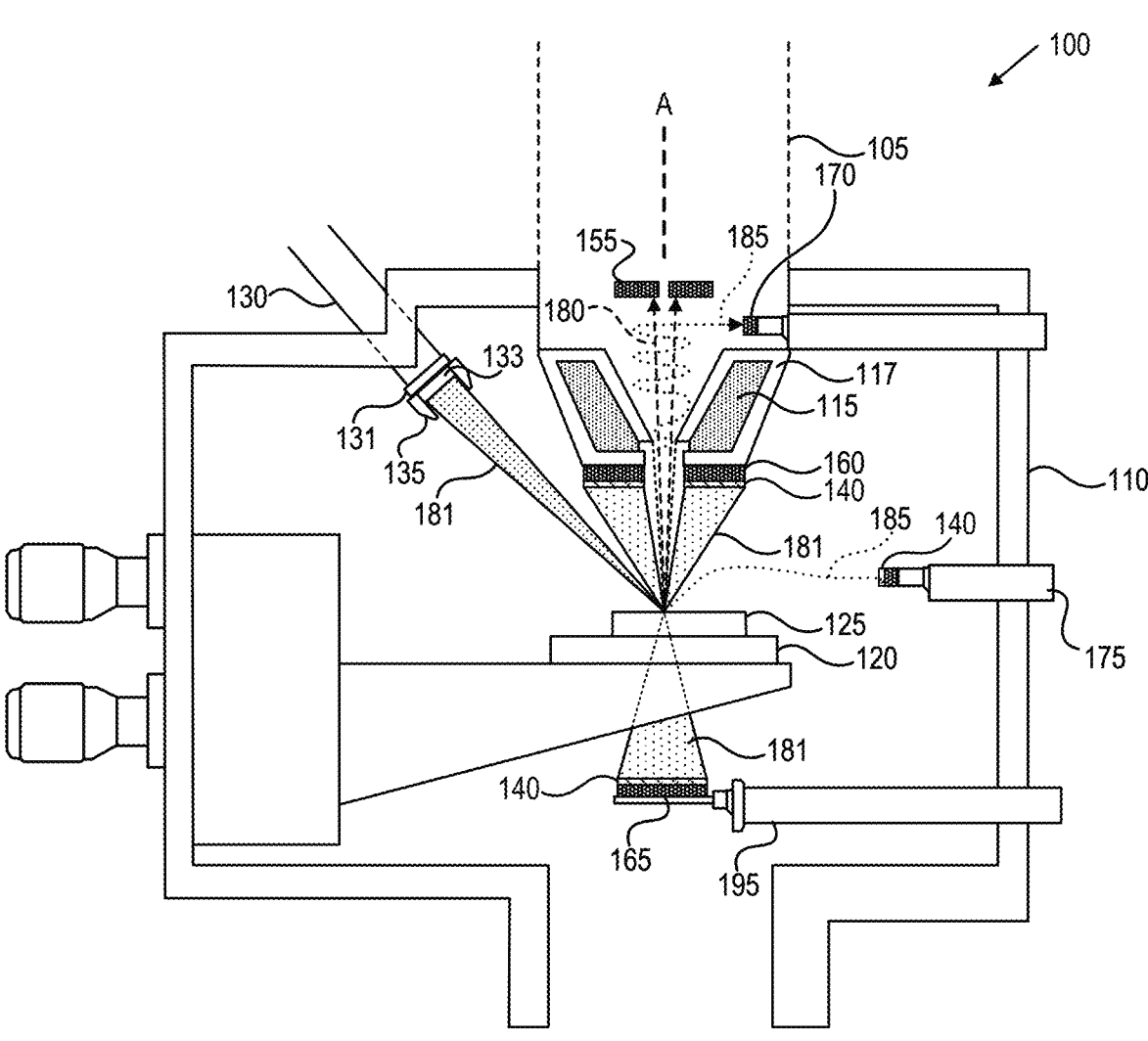
FIG. 1B is a schematic diagram illustrating a detail of the example charged particle microscope system of FIG. 1A, in accordance with some embodiments of the present disclosure.

The vacuum chamber 110 and/or the beam column 105 can include multiple detectors for various signals, including but not limited to secondary electrons generated by interaction of the beam of electrons and the sample, backscattered electrons (BSE), forward scattered electrons (FSE), x-ray photons (e.g., EDAX or EDS), other photons (e.g., visible and/or IR cameras), and/or molecular species (e.g., TOF-SIMS), as described in more detail in reference to FIG. 1B. The vacuum chamber 110 can also include a sample stage 120 that can be operably coupled with a multi-axis translation/rotation control system, such that the sample 125 can be repositioned relative to the beam axis A, as an approach to surveying and/or imaging the sample 125. The sample stage 120 can include windows permitting transmission of electrons or other charged particles through the sample and the sample stage. In this way, one or more detectors of the present disclosure can be disposed in the vacuum chamber 110 and/or in the beam column 105 and configured to detect particles (e.g., electrons, ions, photons, etc.) emanating from the sample (e.g., reflected and/or transmitted), as described in more detail in reference to FIGS. 2A-2B.

Example charged particle microscope 100 is illustrated as a single-beam SEM instrument to focus description on applications of detectors of the present disclosure in detection of x-rays. In some embodiments, charged particle microscope 100 can incorporate an ion-beam source (e.g., a focused ion beam, or FIB) adapted, for example, to modify a sample and/or for microanalysis. In this way, detectors of the present disclosure can be configured to generate detector data (e.g., images, line scans, x-ray spectra, etc.) in coordination with ion-sources used for modification and/or microanalysis of samples. In an illustrative example, a focused ion source (e.g., a FIB, p-FIB, or the like) can be operably coupled with the vacuum chamber 110 and configured to incrementally remove portions of the sample 125 in a layer-wise manner. Between increments, x-ray microanalysis of the sample 125 can provide a depth profile of elemental information in the sample 125.

FIG. 1B is a schematic diagram illustrating a detail of the example charged particle microscope system 100 of FIG. 1A, in accordance with some embodiments of the present disclosure. The detectors include one or more in-column detectors (ID) 155, a pole-piece mounted detector (PMD) 160, a STEM mode detector (SMD) 165, as well as other detectors, such as a through-the-lens detector (TLD) 170 and an Everhart-Thornley detector 175. Other detectors and sources that can be coupled with the vacuum chamber 110 include a conventional x-ray detector 130 (e.g., a silicon drift detector configured for energy dispersive x-ray spectroscopy). Embodiments of the present disclosure include charged particle microscopes including x-ray sources, x-ray detectors, ion-beam sources, mass spectrometers, optical sources (e.g., laser sources), or other sources as would be included in the complement of analytical instruments available for use in SEM microanalysis. At least some of the detectors of the example microscope 100 can be paired with filter(s) 140 in proximity with or overlying the absorption surface(s) of the detector(s), as described in more detail in reference to FIGS. 2A-3C.

Pole-piece mounted detector 160 can be mechanically coupled with a pole-piece 117 housing the objective lens 115 and oriented with the collector surface facing toward the sample stage 120. As described in more detail in reference to FIGS. 2A-3C, PMD 160 can be segmented into multiple detectors, such as dipole, tripole, quadrupole, octopole, or other configurations (e.g., combinations of quadrant and other configurations). PMD 160 can be mounted on a retractable support 195 instead of being mechanically coupled with the pole piece 117. Advantageously, mounting PMD 160 on the retractable support 195 permits the PMD 160 to be removed from between the sample stage 120 and the pole piece 117, allowing other probes, sources, or components to be introduced into the same space (e.g., parabolic mirrors used for luminescence measurement/imaging).

STEM-mode detector 165 can be mechanically coupled with a retractable support 195 configured to introduce the SMD 165 into a position such that the sample stage 120 is between the objective lens 115/pole piece 117 and the SMD 165. SMD 165 can be mechanically coupled with one or more surfaces of the vacuum chamber 110. SMD 165 can be oriented such that the absorption surface faces an underside of the sample stage 120. In this way, x-rays 181 emanating from the sample 125 (e.g., from the region of the interaction volume of the sample in which x-rays are generated) can reach the detector surface and generate characteristic signals used for imaging and/or microanalysis. X-rays 181 can include x-rays generated from inner-shell excitations in atoms of the sample 125 that are directed through the sample rather than back toward the beam column 105. For the SMD 165, the filter 140 can be disposed between the detector 165 and the sample 125, such that charged particles and relatively low energy photons can be absorbed to selectively detect x-rays 181.

The filter 140 can be moveable relative to the detector cells, as described in more detail in reference to FIGS. 2A-6D By placing the filter 140 between the absorption surface of the detector cell and the sample, the detector can generate x-ray data with negligible or no signal attributable of charged particles and relatively low-energy photons (e.g., infrared, visible, and/or ultraviolet photons). In this way, embodiments of the present disclosure provide improved solid collection angle and improved takeoff angle, relative to the conventional x-ray detector 130, with consequent improvement in integration time, signal-to-noise properties, and reduced exposure of sensitive samples to charged particle dose.

The x-ray detector 130 includes a detector 131 that is shielded from charged particles, photons, and other noise sources by a window 133 and a collimator 135, the collective result of which is a significant reduction of the solid collection angle. Additionally, to protect the window material and/or to reduce the interaction between magnetic components of the x-ray detector 130 and the beam of charged electrons, the x-ray detector 130 can be limited to a relatively low takeoff angle, for example, from about 30 to about 50 degrees as measured from a plane defined by the sample surface 125. The takeoff angle can be increased by tilting the sample 125, at a cost of reducing the functionality of detectors 155, 160, 165, and 170 during x-ray collection.

Figure 2A:
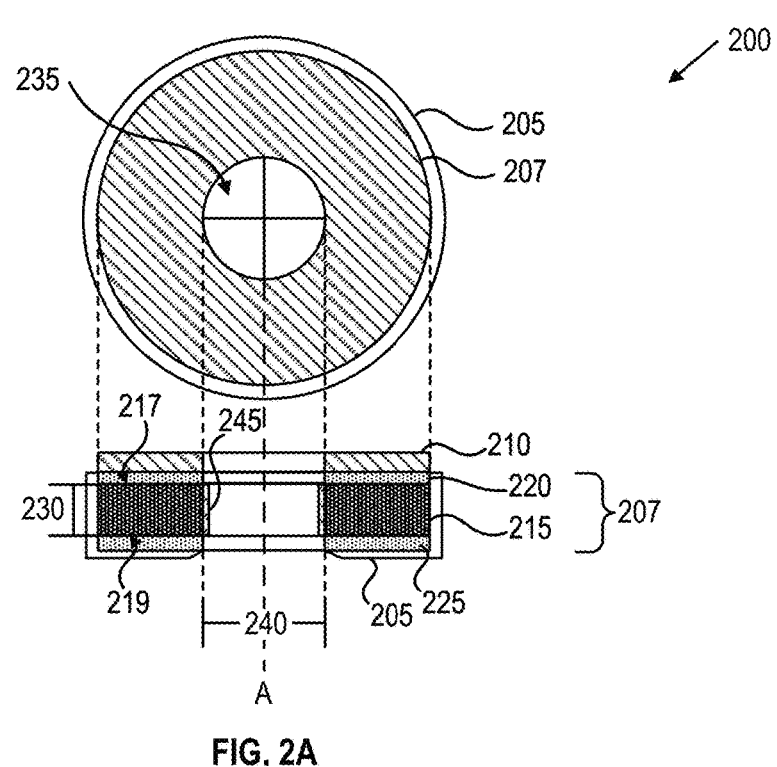
FIG. 2A is a schematic diagram of an example charged particle detector, in accordance with some embodiments of the present disclosure.

FIG. 2A is a schematic diagram of an example particle detector 200, in accordance with some embodiments of the present disclosure. The example detector 200 is an example of the detectors described in reference to FIG. 1B, such as the ID 155, the PMD 160 and/or the SMD 165. As such, example detector 200 includes a retaining element 205, a detector cell 207, and a filter 210. The detector cell 207 includes an acceptor layer 215, a first conducting layer 220, and a second conducting layer 225.

The retaining element 205 can be configured to be incorporated into a scanning electron microscope (SEM), as described in more detail in reference to FIGS. 1A-1B. The retaining element 205 can include mechanical fittings, couplings, and/or features corresponding to a given SEM system. For example, in a PMD 160 the retaining element 205 can include one or more through-holes disposed in the housing corresponding to the position of threaded bore-holes in the pole piece 117, facilitating mechanical coupling of the retaining element 205 with the pole piece 117. The pole piece 117 can be differently configured in different SEM systems. For example, some manufactures can omit some features in favor of others, such that the configuration of the retaining element 205 can be based at least in part on the charged particle microscope into which the retaining element 205 is to be incorporated. Similarly, the retaining element 205 can be configured for mechanical coupling with a support (e.g., retractable support 195 of FIG. 1B). As described in more detail in reference to FIG. 6A, the support can be a retractable arm permitting the example detector 200 to be oriented toward a sample and/or beam target (e.g., sample 125 of FIG. 1). In this way, the retaining element 205 can tilt and/or linearly translate.

The detector cell 207 can be mechanically coupled with the retaining element 205, for example, by adhesive, retaining clips, tensioners, screws, or the like. The acceptor layer 215 can define a first surface 217 and a second surface 219. The second surface 219 is illustrated as opposing the first surface 217, but can also be in a different configuration. The first conducting layer 220 can be disposed overlying the first surface 217. The second conducting layer 225 can be disposed overlying the second surface 219. In some embodiments, the first conducting layer 220 and/or the second conducting layer 225 can be or include a metal, a transparent conductive material, a conductive carbon film, and/or other conductive materials compatible with chemical vapor deposition, physical vapor deposition, epitaxy, or other techniques used to deposit conductive materials with controlled purity and thickness on the order of tens to hundreds of nanometers. To that end, first conducting layer 220 can be characterized by a substantially uniform thickness (e.g., limited by and within tolerances of the fabrication method) below a threshold at which the conductive material interferes with incident particles. The first conducting layer 220 can be disposed as a patterned film or patterned layer over the acceptor layer (e.g., in the shape of a grid or other geometric configuration) used to distribute the electrostatic field on the surface. In this case, the first surface 217 will not covered by material of 220 in the meshes of the grid, which may improve detection of some of the incoming particles.

The acceptor layer 215 can be characterized by a thickness 230 between the first conducting layer 220 and the second conducting layer 225 from about 10 μm to about 500 μm, including sub-ranges, fractions, and interpolations thereof. As described in more detail in reference to FIG. 1B, space constraints in the region between the sample stage 120 and the pole piece 117 militate against a larger value for the thickness 230. For example, contact between the sample stage and the charged particle detector 200 can damage the first conducting layer 220 and/or the acceptor layer 215. In contrast, a smaller value for the thickness 230 can increase a probability that particles incident on the first surface 217 of the acceptor layer 215 will transit through the acceptor layer 215 without generating a detectable signal or will reduce the detector efficiency at higher particle energies.

In some embodiments, detector cell 207 and/or retaining element 205 define an aperture 235. The aperture can be included in the example detector 200 to permit a beam of electrons (e.g., beam of electrons 190 of FIG. 1B) to pass through the retaining element 205 and/or the detector cell 207. While the nominal diameter of the beam of electrons can be on the order of tens of nanometers, electromagnetic interaction between the detector cell 207 and the beam of electrons can influence a value of a diameter 240 below which the beam is affected by the presence of the detector 200 (e.g., the beam is deformed or at least partially blocked or interferes with the detector cell 207). For at least these reasons, the aperture 235 can be characterized by a diameter 240 from about 0.1 mm to about 10 mm, including sub-ranges, fractions, and interpolations thereof. For example, the diameter 240 can be about 0.1 mm, about 0.2 mm, about 0.3 mm, about 0.4 mm, about 0.5 mm, about 0.6 mm, about 0.7 mm, about 0.8 mm, about 0.9 mm, about 1.0 mm, about 2.0 mm, about 3.0 mm, about 4.0 mm, about 5.0 mm, about 6.0 mm, about 7.0 mm, about 8.0 mm, about 9.0 mm, or about 10.0 mm including fractions and interpolations thereof.

As described in more detail in reference to FIG. 1B, angular distribution of particles of interest (e.g., x-rays 181 of FIG. 1B) relative to the sample 125 surface can serve as constraints on the diameter 240 of the aperture 235. For example, in the case of an x-ray detector, x-ray flux increases nearer to the beam axis A, such that detector performance improves in general for smaller values of the diameter 240. In contrast, interference between the detector 200 and the beam of electrons 190 can impair the functioning of the charged particle microscope system and/or the detector 200. In this way, the diameter 240 can be limited by a lower threshold below which the detector 200 interferes with the operation of the charged particle microscope and by a general design consideration to reduce the diameter 240.

In some embodiments, a conducting film 245 (e.g., gold, aluminum, etc.) can be disposed overlying an internal surface of the aperture. The conducting film 245 can be electronically coupled with the first conducting layer 220 or the second conducting layer 225, or can be electronically isolated from both the first conducting layer 220 and the second conducting layer 225. The conducting film 245 can be included as part of incorporating the example detector 200 into the beam column 105, for example by shielding the acceptor layer from primary electrons, secondary electrons 185, or the like.

The detector cell 207 can be shaped to accommodate the aperture 235. In this context, accommodating the aperture 230 refers to the aperture 235 extending through the detector cell 207 and perforating the first conducting layer 220, the acceptor layer 215, and the second conducting layer 225, such that the beam axis passes through the aperture 235, with the first conducting layer 220 oriented facing the sample stage 120 to act as an absorbing surface, as described in more detail in reference to FIG. 1B. For example, charged particle detector 200 configured as PMD 160 can include the aperture 235 with the detector cell 207 shaped to accommodate the aperture 235. In contrast, the aperture 235 can be formed in the retaining element 205, rather than the detector cell 207 in configurations where the signal of interest emanates from the sample 125 at an angle between the beam axis A and the sample surface.

The example detector 200 is shown in an annular form factor. Embodiments of the present disclosure include additional and/or alternative form factors, including but not limited to rectangular form factors or other polygonal form factors. Similarly, the schematic diagram of FIG. 2A is not intended to limit the geometric arrangement of constituent elements of example detector 200. Example detector 200 is illustrated in a concentric configuration, with aperture 235 being substantially centered in the detector cell 207. In some embodiments, however, the aperture 235 can be offset relative to a geometric center of the detector cell 207, for example, where the detector cell 207 is shaped to collect particles emanating from a specific angle relative to the beam axis A and/or across a range of angles that are not rotationally symmetrical about the beam axis A.

Figure 2B:
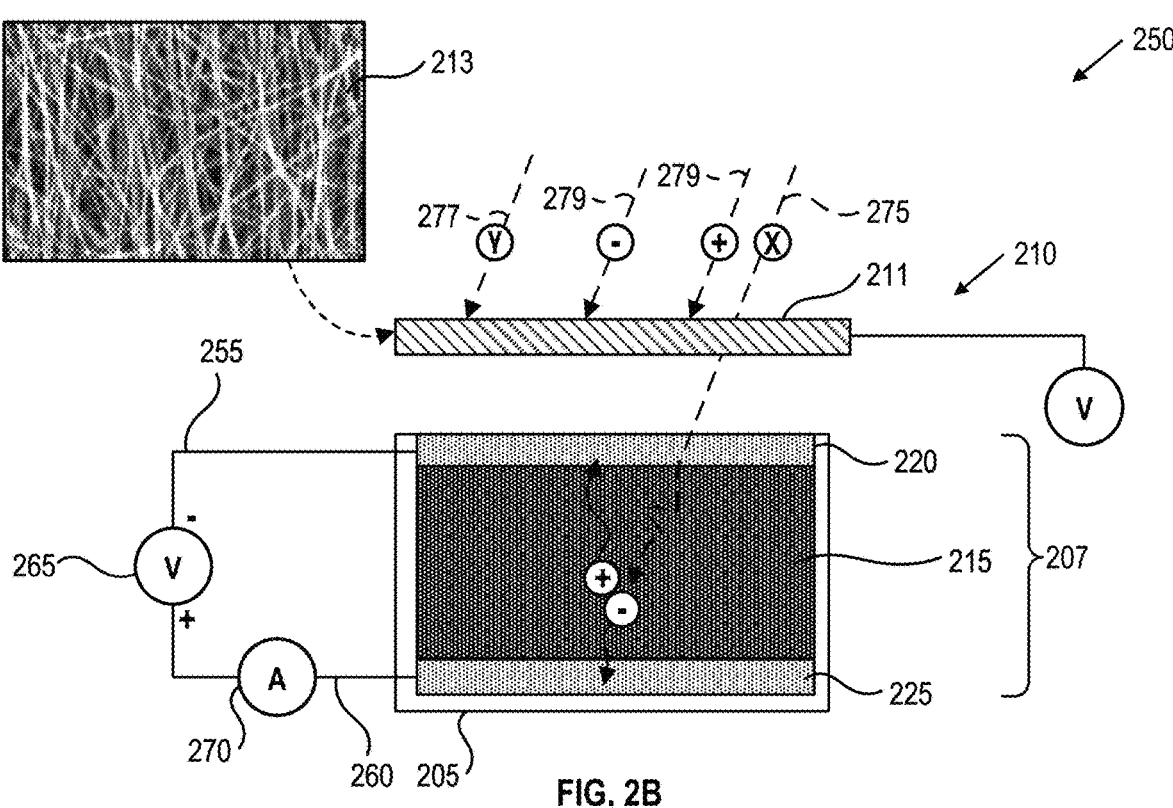
FIG. 2B is a schematic diagram of an example detector, in accordance with some embodiments of the present disclosure.

FIG. 2B is a schematic diagram of an example detector 250, in accordance with some embodiments of the present disclosure. Example detector 250 includes detector cell 207 with acceptor layer 215, first conducting layer 220, and second conducting layer 225, mechanically coupled with retaining element 205, as described in reference to FIG. 2A. The example detector 250 includes a first contact 255, a second contact 260, bias circuitry 265, and current measurement circuitry 270.

The first contact 255 is electrically coupled with the first conducting layer 220. The second contact 260 is electrically coupled with the second conducting layer 225. In this way, the example detector 250 can be configured to apply a bias voltage across the acceptor layer 215. For example, bias circuitry 265 can be configured to apply a bias voltage across the acceptor layer 215 having a magnitude from about 0.1 V to about 5 kV, including sub-ranges, fractions, and interpolations thereof. Larger magnitudes of the bias voltage increase the likelihood that the charged particle detector will interfere with the operation of the charged particle microscope (e.g., by forming local discharges or by deflecting and/or deforming the beam of primary electrons 190). In contrast, smaller magnitudes of the bias voltage can impair the performance of charged particle detectors of the present disclosure (e.g., by favoring electron-hole recombination).

Without being bound to a particular physical mechanism or phenomenon, particle detectors of the present disclosure can be configured to generate electrical signals in response to incidence of energetic particles 275 (e.g., x-rays 181 of FIG. 1A) onto the absorption surface 217 of the acceptor layer 215 (e.g., through orientation of the first conducting layer 220 toward the sample stage 120). Penetration of the energetic particles 275 into the acceptor layer can generate electron-hole pairs that can be separated and driven to respective conducting layers by force of the bias voltage. Current measurement circuitry 270 can be configured to integrate the current drawn from acceptor layer 215 and/or returned to the ground or relative ground over a period of time (e.g., coordinated with the scan pattern of the SEM as part of imaging or for a defined exposure time for spot-mode analysis). The magnitude of the bias voltage can be based at least in part on the thickness 230 of the acceptor layer 215, as an approach to improving detector efficiency (e.g., by reducing the probability of electron-hole recombination in the acceptor layer 215).

The filter 210 can include a membrane 211. The membrane 211 can include materials that exhibit selective transmissivity to x-rays 275. Selective transmissivity refers to the membrane 211 permitting at least a portion of incident x-rays 275 of a given energy to pass through the filter 210, while absorbing, reflecting, or otherwise blocking the transmission of other forms of incident particles, such as relatively low-energy photons 277 and charged particles 279 (e.g., electrons, ions, etc.). The membrane 211 material can block all or substantially all photons 277 and charged particles 279 below respective threshold energies. For example, the membrane 211 can absorb, reflect, or otherwise block substantially all electrons having an energy of about 7.8 keV or less, as described in more detail in reference to FIG. 7. In some embodiments, the threshold energy can be selected based at least in part on the thickness of the filter and/or the density of the filter as parameters. For example, a filter with a thickness of about 2 um can block incident electrons having an energy below about 2.5 keV. While lower than 7.8 keV, the thickness dependency of filter performance permits tuning of operating conditions, as described in more detail in reference to FIGS. 4-7. Further, the threshold energy can depend at least in part on the composition of the membrane 211. For example, a membrane 211 including multiwall carbon nanotubes can be characterized by a higher threshold energy, relative to a membrane 211 including single wall carbon nanotubes. Similarly, a membrane 211 having a relatively higher density of nanotubes per unit surface area can be characterized by a higher threshold energy than a membrane 211 having a relatively lower density of nanotubes per unit surface area. In an illustrative embodiment, an areal density is defined as the mass of membrane 211 material per unit surface area (e.g., square centimeters). Characteristics of the membrane 211 can be described and/or related via the areal density, based at least in part on characteristic volumetric properties including volumetric density (e.g., mass per volume) of the carbon material and/or void percentage of the membrane (e.g., average proportion of empty space in the membrane). In some embodiments, the volumetric density of the carbon material is from about 0.11 $g/cm^3$ to about 1.1 $g/cm^3$, including sub-ranges fractions, and interpolations thereof. In some embodiments, transparency and thickness are inversely related. For example, for a given areal density, a membrane thickness of about 1.32 μm can correspond to a transmissivity at 550 nm of about 3.5%, while a membrane thickness of about 2.64 μm can correspond to a transmissivity of about 0.12%. In this way, for a given membrane, both the thickness and the transparency of the membrane can be referenced to the areal density. For example, the areal density can be from about 0.1 $μg/cm^2$ at to about 330 $mg/cm^2$, including sub-ranges, fractions, and interpolations thereof, permitting the dimensions, number of layers, and individual layer thickness of the membrane 211 to be determined based at least in part on a balance between transparency and dimensional/space constraints.

In some embodiments, the membrane 211 includes a carbonaceous material 213. The carbonaceous material 213 can include carbon nanotube materials. The carbon nanotube materials can include single-walled nanotubes, double-walled nanotubes, multi-walled nanotubes, and/or mixtures thereof. The carbonaceous material 213 can include carbon nanofiber, nano-bamboo, other forms of $sp^2$ hybridized carbon, $sp^3$ hybridized carbon, and/or mixtures thereof (e.g., a combination of graphitic and amorphous carbon). Nanotubes, nano-bamboo, and/or nanofibers can be oriented along a one or more in-plane directions and/or can be randomly oriented. For example, the membrane 211 can include layer(s) in which the carbon nanotubes making up a carbon nanotube felt are substantially aligned with an orientation direction. Different layers can be oriented in the same direction or in different direction(s). While substantially aligned with an orientation direction over a given layer and/or membrane 211, individual nanotubes, nanofibers, etc., can exhibit tortuosity (e.g., curving, angulation/kinking, looping, and/or spiral twisting segments) such that segment(s) of a given nanotube, nanofiber, etc., can be oriented away from the orientation direction. The membrane 211 can further include metal, ceramic, and/or nitride materials, for example, as a coating, inclusion, or other form that does not substantially limit the transmissivity of the filter 210. The membrane 211 can be electrically coupled to a potential (e.g., a ground potential, a positive bias, a negative bias). Advantageously, electrically grounding the membrane 211 can improve the absorption and/or neutralization of charged particles 279 (e.g., absorption of electrons and/or surface recombination of ions), without significantly affecting the performance of other components of the charged particle microscope system in which the example detector 250 is disposed.

The membrane 211 can have a thickness on the order of about 10 nm to about 10 um (e.g., from about 10 nm to about 99 um), including subranges (e.g., from about 0.5 μm to about 30 um), fractions, and interpolations thereof. The membrane 211 can include multiple layers of carbon nanotube material being from about 3 nm thick to about 1 μm thick, individually, including subranges, fractions, and interpolations thereof. In an example, each layer can have a thickness of about 0.4 um, such that a membrane having two layers of carbon nanotube material can be about 0.8 um thick and a membrane having 25 layers of carbon nanotube material can be about 10 μm thick. Without being bound to a particular physical phenomenon or mechanism, the filter

210 can have a thickness-dependent transmissivity, based at least in part on the absorbance of each constituent layer. In this way, the membrane 211 can include a number of layers that permits the filter 210 to absorb substantially all incident photons 277 and/or charged particles 279, while permitting the transmission of a significant portion of x-rays 275.

Each layer can have a photon absorbance from about 1% to about 90% (e.g. as measured at 525 nm). In the example of 25 layers of carbon nanotube material, where each layer has an absorbance of about 40% at 525 nm, the overall absorption factor of the membrane 211 for photons at 525 nm can be about $1\times10^{-9}$. In the example of a membrane 211 having a thickness of about 2 μm, the transmissivity of Li Kα (55 eV) x-rays 275 can be about 23%, corresponding to an improvement of about 5× relative to current detectors (as described in reference to FIG. 7). Further, comparative example detectors of the current art, for which carbon material is included as part of a window layer, typically include support grids that introduce artifacts and light-tight aluminum coatings on at least one surface of the window layer, which further reduces quantum efficiency of the detector. In contrast, detectors of the present disclosure can include an at least partially unsupported membrane 211, held by a frame (e.g., frame 315 of FIG. 3A) around at least a portion of the membrane 211.

The example detector 250, like example detector 200, can be configured to be incorporated into example charged particle microscope 100 of FIGS. 1A-1B. Further, the components and/or materials of example detector 250 can be included as part of example detector 200, omitted from FIG. 2A and its accompanying description to focus on geometrical aspects. To that end, FIG. 2B is provided to describe electronic and material aspects of detectors of the present disclosure. In an illustrative example, example detector 250 can include the aperture 235 of example detector 200. Similarly, example detector 200 can include electronic components and materials of detector 250.

FIG. 3A is a schematic diagram of an example detector 300 including a silicon drift detector cell 305, in accordance with some embodiments of the present disclosure. The example detector 300 further includes a filter 310 and electronic circuitry 350, electrically coupled with the silicon drift detector cell 305. For example, the detector 305 can include an absorption surface 335 and a set of annular electrical contacts 340 that are patterned on the surface of the detector 305 such that charges generated within the active layer (e.g., active layer 215 of FIG. 2A) of the detector 330 are drawn toward a central anode region 345 of the detector cell 305.

The filter 310 includes a membrane 311 in a frame 315. The frame is coupled with a retention arm 320 by which the filter 310 can be positioned relative to the detector cell 305. In some embodiments, the filter 310 can be moved relative to the detector cell 305. As shown, the filter 310 is positioned between a source of x-rays 317 and the detector 305. In this way, the filter can selectively absorb, reflect, or otherwise block incident particles other than x-rays 375.

The membrane 311 includes multiple layers 313 of filter material, as described in more detail in reference to FIG. 2B. The frame 315 can be coupled with the membrane 311 over at least a portion of the periphery of the membrane 311. In this way, the frame 315 mechanically supports the membrane 311, permitting the membrane 311 to be substantially free standing over the region of the filter 310 that corresponds to the detector 305.

FIG. 3B is a schematic diagram of an example detector 330 including multiple filter segments 355 in a quadrant arrangement, in accordance with some embodiments of the present disclosure. The segments 355 can be formed from a single membrane 311, supported by a circular frame 315. In this way, the filter 310 can accommodate an aperture 370 (e.g., aperture 235 of FIG. 2A), for example, through which a beam of charged particles can be directed. Additionally or alternatively, the segments 355 can be formed from multiple membranes 311. The segments can have similar or different properties, such as thickness, transmissivity, or the like. Advantageously, the different segments can permit different detector segments to interrogate different energy ranges, for example, by applying different absorption coefficients for x-rays (e.g., x-rays 181 of FIG. 1B) at given energies of interest for a given sample.

FIG. 3C illustrates a portion of the example detector module 330 that is occluded by the filter 310 that includes the detector surface with multiple silicon drift detectors 305 in a quadrant arrangement, in accordance with some embodiments of the present disclosure. The example detector module 330 can accommodate the central aperture 370, among other ways, by including multiple silicon drift detectors 305 that are relatively smaller or otherwise shaped to be disposed in an arrangement about the central aperture 370 that optimizes collection efficiency. The number and arrangement of silicon drift detectors 305 can vary, based at least in part on the size of the detector module 330 and the sizes of the silicon drift detectors 305.

In some embodiments, one or more charged particle detectors 360 can be included with the silicon drift detectors 305. Advantageously, the filter 310 can be at least partially absent in the vicinity of the charged particle detector(s) 360, for example, by forming an aperture in the membrane 311 and/or by omitting one or more segments 355 from the filter 310. In this way, the example detector module 330 can generate multi-modal detector data sets that include x-ray data (e.g., EDS data) and electron data (e.g., BSE data, SE data, etc.) concurrently. Such data of different modalities can be stored separately and correlated as part of a datacube, for example, in reference to a position on the sample surface as part of imaging/mapping processes.

Figure 4:
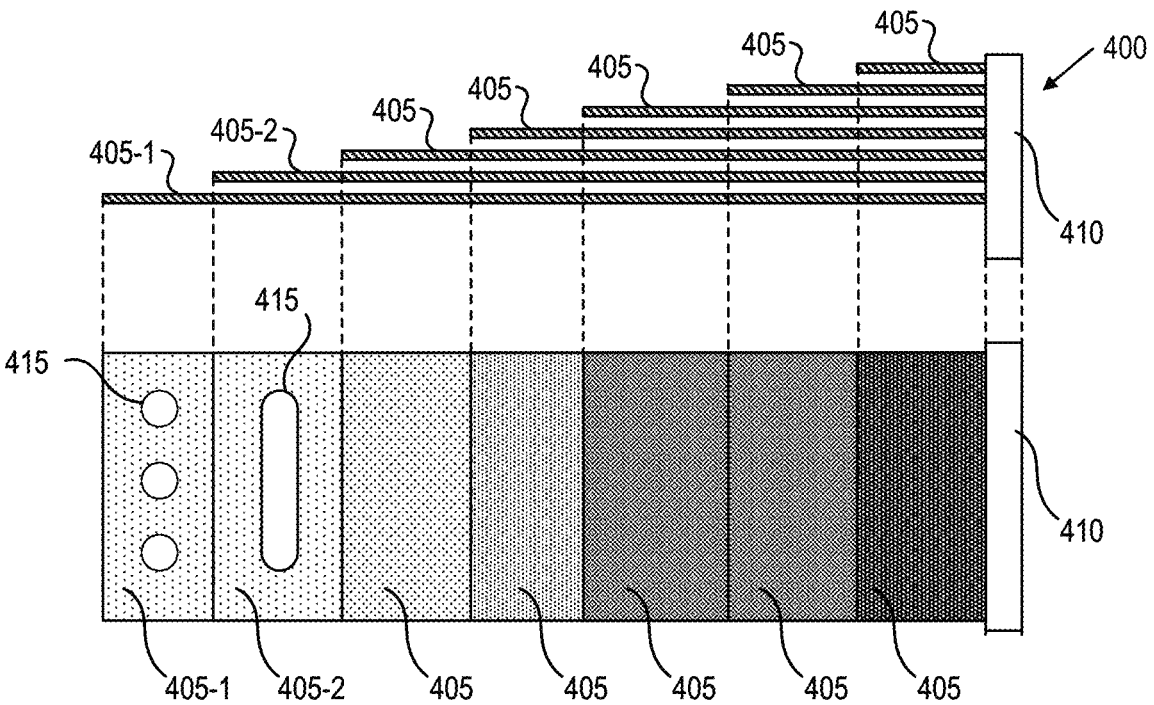
FIG. 4 is a schematic diagram of an example filter defining a spatially variant transmissivity, in accordance with some embodiments of the present disclosure.

FIG. 4 is a schematic diagram of an example filter 400 defining a spatially variant transmission coefficient, or transmissivity, in accordance with some embodiments of the present disclosure. Example filter 400 includes multiple layers 405 of filter material. The layers 405 are at coupled with a frame 410. As described in more detail in reference to FIG. 3A, the layers 405 and the frame 410 can be structured such that the filter is disposed relative to an x-ray detector to shield an absorption surface (e.g., first surface 217 of FIG. 2A) from incident particles including electrons, ions, relatively low energy photons, or the like.

As described in more detail in reference to FIGS. 2B-3A, the layers 405 can include carbon nanotube material. For example, the carbon nanotube material can include multi-wall carbon nanotubes. Additionally, the carbon nanotube material can be formed in a nonwoven felt. In some embodiments, example filter 400 is configured such that the layers 405 differ from each other by one or more properties and/or parameters, such that the example filter 400 exhibits a spatially variant transmissivity. In one example, the transmissivity variation can be the result of physical modification of the filter by directed energy tools (e.g., via laser, electron beam, ion beam, etc.). In this way, the aggregate thickness of the filter can vary spatially. Spatial variation can be achieved by including layers 405 having differing lateral and/or thickness dimensions. In the illustrated example of FIG. 4, example filter 400 includes a first layer 405-1 having a first length that is longer than a second length of a second layer 405-2. The result, when reproduced by multiple layers 405 of the example filter 400, is a substantially linear (e.g., stair-step) dependency of transmissivity on lateral position in the example filter 400, as described in more detail in reference to FIG. 5. An analogous result can be obtained by spatially thinning layers 405, additionally or alternatively to truncating layers 405. For example, the first layer 405-1 can be relatively thinner and/or relatively thicker than the second layer 405-2 at different lateral positions in the first layer 405-1. In this way, the example filter 400 can be define an arbitrary spatial transmissivity variation (e.g., a gaussian shape as illustrated in FIG. 5).

The example filter 400 can define a spatially variant transmissivity that provides one or more regions of relatively high transmissivity and one or more regions of relatively low transmissivity. In some embodiments, example filter 400 also includes various features 415. The features 415 can include through-holes, slits, apertures, and/or other patterns that be transferred onto and/or into one or more layers 405 by removal and/or deposition of material. The features 415 can be at least partially aligned, such as a concentric arrangement of apertures that together define a gaussian transmissivity profile. As described in more detail in reference to FIG. 3C, the features 415 can include an aperture that substantially aligns with the charged particle detector(s) 360, thereby permitting detectors of the present disclosure to concurrently generate x-ray and electron microscopy (e.g., electron image) data.

In some embodiments, layers 405 are coupled with the frame 410 on a single side, but can also be coupled with the frame 410 on multiple sides, as illustrated in FIG. 3A. In some embodiments, each layer 405 is held in a respective frame 410, such that the filter 400 includes multiple frames. As described in more detail in reference to FIGS. 6A-6C, such configurations can permit the filter 400 and/or the individual filter layers 405 to be addressable and/or move-able, permitting the transmissivity of the filter 400 to be dynamic. Advantageously, varying the transmissivity of the filter dynamically permits the properties of the filter to be tuned to characteristics of a given sample (e.g., the sample 125 of FIG. 1A). In an illustrative example, a sample that emits a relatively high proportion of backscatter electrons (e.g., a relatively heavy element) can benefit from a relatively lower overall transmissivity, implemented by including more layers 405, while a sample that emits a relatively low proportion of x-rays can benefit from a relatively higher transmissivity, implemented by removing one or more layers 405. In this way, a single filter 400 can provide a range of transmissivity values.

Figure 5:
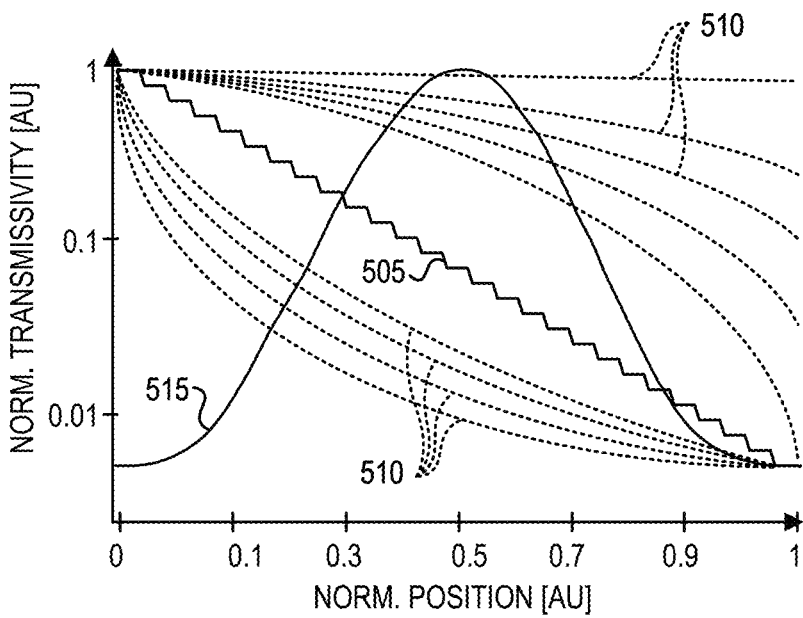
FIG. 5 is a plot of example data for normalized transmissivity of a filter, as a function of position, in accordance with some embodiments of the present disclosure.

FIG. 5 is a plot of example data for normalized transmissivity of a filter, as a function of position, in accordance with some embodiments of the present disclosure. The plot includes simulated data for positionally-variant transmissivity for a given energy, normalized to a maximum value at a given position. The distributions can arise from spatial modification of the filter (e.g., layers 405 of FIG. 4), as described in more detail in reference to FIG. 4. The positionally-variant transmissivity can assume a "stair-step" distribution 505, corresponding to a series of truncated layers. Where a layer is patterned by local removal of material, for example, by ion milling of a filter material (e.g., a carbon nanotube felt), the transmissivity can assume a smooth distribution 510 with position, based at least in part on the local removal extent. As described in reference to FIG. 4, the transmissivity can follow a non-linear function, such as a gaussian 515 distribution, centered about a central position.

Figures 6A, 6B, 6C, 6D:
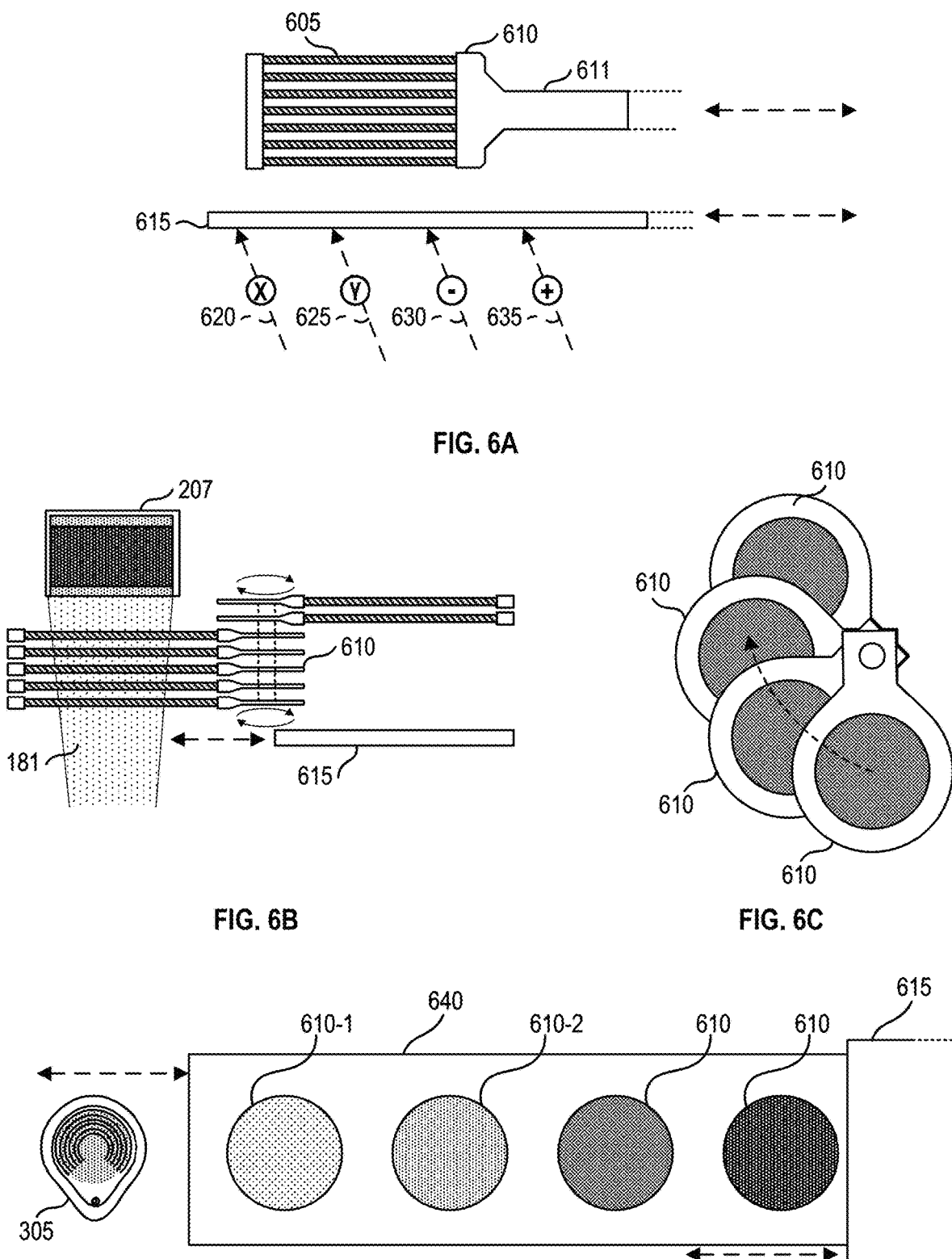
FIG. 6A is a schematic diagram of an example filter being movable relative to an example shield, in accordance with some embodiments of the present disclosure.
FIG. 6B is a schematic diagram of an example filter being movable relative to an example shield, in accordance with some embodiments of the present disclosure.
FIG. 6C is a schematic diagram of an example filter being movable relative to an example shield, in accordance with some embodiments of the present disclosure.
FIG. 6D is a schematic diagram of an example filter cassette being movable relative to an example detector cell and an example shield, in accordance with some embodiments of the present disclosure.

FIG. 6A is a schematic diagram of an example filter 610 being movable relative to an example shield 615, in accordance with some embodiments of the present disclosure. The filter 610 includes multiple layers of membrane 605 material and a retention member 611, as described in more detail in reference to FIGS. 2A-5. The retention member (e.g., frame 315 and support 320 of FIG. 3A) can be movable relative to the shield 615, such that the shield 615 and/or the filter 610 can be moved relative to a detector cell (e.g., detector cell 207 of FIG. 2A).

The shield 615 can be or include a material that is opaque to multiple species of incident particles, such as x-rays 620, other photons 625, electrons 630, and/or ions 635. The shield 615 can include a conductive material (e.g., metal or the like) that, through a combination of physical and dimensional properties, permits the shield to absorb, reflect, or otherwise block the particles. Advantageously, the shield 615 permits the filter 610 and/or the detector to be protected from damaging particles. In an illustrative example, where the detector is disposed in a dual-beam system, the shield can be moved into place, or the filter and/or detector can be moved behind the shield, during the operation of a focused ion beam that generates relatively high ion flux that would otherwise damage the filter and/or the detector.

FIG. 6B illustrates how the example filter 610 being movable relative to the example shield 315 can also facilitate a modifiable transmissivity. In the illustrated embodiment of FIG. 6B, a cassette of filter 610 elements are protected by the shield 615 when retracted, and can be rotated into position over the detector when used. The transmissivity, in turn, is proportional to the number of filter 610 elements that are in position. The rotation motion is illustrated in FIG. 6C, showing the rotation motion of multiple filter elements 610. In some embodiments, the motion is linear, rather than rotational, with filter 610 elements being retracted behind the shield 615 via linear translation. The shield 615 can be moveable relative to the filter 610 elements and/or the detector. For example, the shield can be moved into a position to protect the filter 610 elements and the detector, as when a process is undertaken that generates a damaging environment for the detector (e.g., ion-beam milling of a sample that generates significant ion and electron flux).

FIG. 6D is a schematic diagram of an example filter cassette 640 being movable relative to an example detector cell 305 and an example shield 615, in accordance with some embodiments of the present disclosure. The example filter cassette 640 represents an alternative embodiment, where membrane material 605 is held in a frame including multiple filter 610 elements. The different filter 610 elements can have different transmissivity properties. For example, a first filter element 610-1 can have a relatively higher transmissivity at a given energy than a second filter element 610-2 in the cassette 640. In this way, by moving the cassette 640 relative to the detector cell 305 such that a given energy can be selected by suppressing lower energy background signals.

Figure 7:
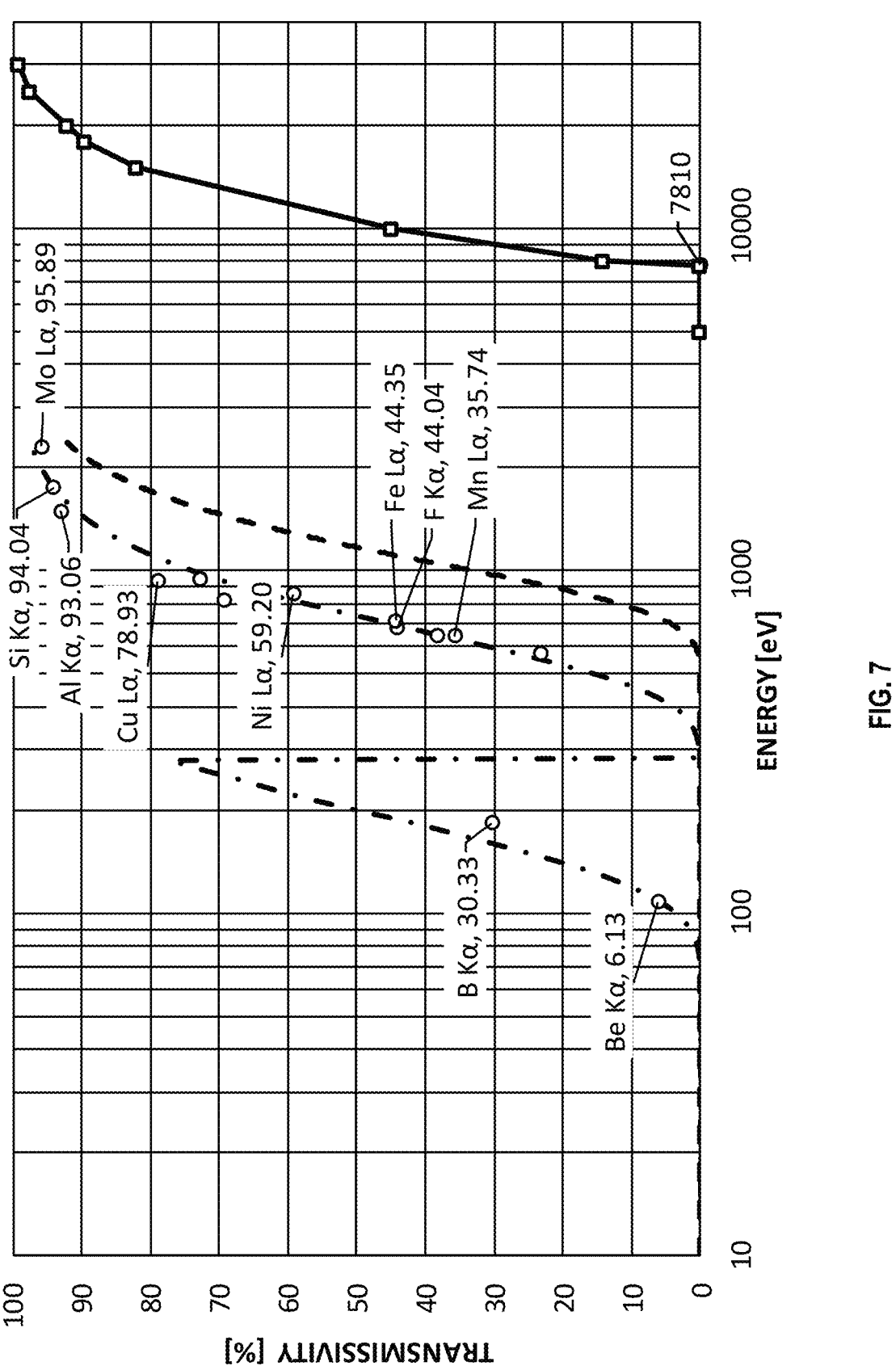
FIG. 7 is a plot of example transmissivity data for multiple particles and detectors, in accordance with some embodiments of the present disclosure.

FIG. 7 is a plot of example transmissivity data for multiple types of detectible signals, in accordance with some embodiments of the present disclosure. The plot in FIG. 7 provides experimental data demonstrating improved performance of the detectors of the present disclosure, relative to detectors that include beryllium filters. Detectors of the present disclosure exhibit improved x-ray transmissivity relative to beryllium windows, and reduced electron transmissivity and reduced artefact content relative to polymer or silicon nitride windows. For example, polymer and silicon nitride windows are typically supported by grids or other structures to reinforce the window structurally. These structures reduce the quantum efficiency of the detector and can introduce artefacts attributable to the material from which the structures are made.

In the plot, the abscissa and ordinate plot transmissivity of the filter to x-rays (in dashed lines) and to electrons (in solid lines) against energy in electron volts. Transmissivity data for filters of the present disclosure are provided in hollow circles (○) for x-ray data and in hollow squares (□) for electron data. The dash-dot line (- • -) provides a simulated x-ray transmissivity curve for filters of the present disclosure, while the dashed line (- - -) provides a simulated x-ray transmissivity curve for a conventional x-ray detector (e.g., detector 130 of FIGS. 1A-1B) provided with a pure beryllium window.

The data in FIG. 7 illustrate that detectors of the present disclosure exhibit improved sensitivity to x-rays, relative to beryllium-filtered detectors. Further, detectors of the present disclosure are substantially blind to electron flux, as evidenced by the transmissivity for filters of the present disclosure being at or near zero percent for electrons having an energy equal to or below about 7.8 keV, corresponding to an energy greater than the Mo Lα x-ray line by almost two orders of magnitude. In contrast to typical polymer membrane windows, detectors of the present disclosure provide improved x-ray sensitivity and electron opacity.

Further, detectors of the present disclosure outperform beryllium-filtered detectors of the current art across a range of x-ray energies from about 75 eV to about 1150 eV, encompassing numerous characteristic x-ray lines for elements including, but not limited to, beryllium (Kα), boron (Kα), manganese (Lα), fluorine (Kα), iron (Lα), nickel (Lα), copper (Lα), aluminum (Kα), silicon (Kα), and molybdenum (Lα). In an illustrative example, drawn from the data of FIG. 7, detectors of the present disclosure exhibit improvement in transmissivity of about 20% to about 40%, relative to beryllium filtered detectors, for iron, nickel, and copper Lα lines. Advantageously, filters of the present disclosure are substantially opaque to visible and infrared photons (e.g., photons 277 of FIG. 2B). In this way, detectors of the present disclosure can be used for measurement of luminescent samples and/or heated samples, for which photon noise in detector data can be significant with current detector technology.

In the preceding description, various embodiments have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described. While example embodiments described herein center on spectrometry systems, and x-ray spectrometry systems in particular, these are meant as non-limiting, illustrative embodiments. Embodiments of the present disclosure are not limited to such embodiments, but rather are intended to address analytical instruments systems for which a wide array of material samples can be analyzed to determine chemical, elemental, physical, structural, or other properties, among other aspects, including but not limited to chemical structure, trace element composition, or the like.

Some embodiments of the present disclosure include a system including one or more data processors and/or logic circuits. In some embodiments, the system includes a non-transitory machine-readable storage medium containing instructions which, when executed on the one or more data processors and/or logic circuits, cause the one or more data processors and/or logic circuits to perform part or all of one or more methods and/or part or all of one or more processes and workflows disclosed herein. Some embodiments of the present disclosure include a computer-program product tangibly embodied in non-transitory machine-readable storage media, including instructions configured to cause one or more data processors and/or logic circuits to perform part or all of one or more methods and/or part or all of one or more processes disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the claims. Thus, it should be understood that although the present disclosure includes specific embodiments and optional features, modification and variation of the concepts herein disclosed may be resorted to by those skilled in the art, and that such modifications and variations are considered to be within the scope of the appended claims.

Where terms are used without explicit definition, it is understood that the ordinary meaning of the word is intended, unless a term carries a special and/or specific meaning in the field of charged particle microscopy systems or other relevant fields. The terms "about" or "substantially" are used to indicate a deviation from the stated property within which the deviation has little to no influence of the corresponding function, property, or attribute of the structure being described. In an illustrated example, where a dimensional parameter is described as "substantially equal" to another dimensional parameter, the term "substantially" is intended to reflect that the two parameters being compared can be unequal within a tolerable limit, such as a fabrication tolerance or a confidence interval inherent to the operation of the system. Similarly, where a geometric parameter, such as an alignment or angular orientation, is described as "about" normal, "substantially" normal, or "substantially" parallel, the terms "about" or "substantially" are intended to reflect that the alignment or angular orientation can be different from the exact stated condition (e.g., not exactly normal) within a tolerable limit. For dimensional values, such as diameters, lengths, widths, or the like, the term "about" can be understood to describe a deviation from the stated value of up to ±10%. For example, a dimension of "about 10 mm" can describe a dimension from 9 mm to 11 mm.

The description provides exemplary embodiments, and is not intended to limit the scope, applicability or configuration of the disclosure. Rather, the ensuing description of the exemplary embodiments will provide those skilled in the art with an enabling description for implementing various embodiments. It is understood that various changes may be made in the function and arrangement of elements without departing from the spirit and scope as set forth in the appended claims. Specific details are given in the description to provide a thorough understanding of the embodiments. However, it will be understood that the embodiments may be practiced without these specific details. For example, specific system components, systems, processes, and other elements of the present disclosure may be shown in schematic diagram form or omitted from illustrations in order not to obscure the embodiments in unnecessary detail. In other instances, well-known circuits, processes, components, structures, and/or techniques may be shown without unnecessary detail.

What is claimed is:

1. A detector, comprising: a detector cell, configured to generate an electrical signal in response to a particle incident on an active layer of the detector cell, the active layer defining an absorption surface; and a filter, comprising a membrane of carbon material comprising a layer of nonwoven carbon nanotube felt, the filter being disposed relative to the detector cell to shield the absorption surface from a subset of the incident particles, the subset comprising electrons, ions, and photons, the photons having an energy less than about 40 eV.

2. The detector of claim 1, wherein the membrane comprises multiple substantially planar layers of carbon nanotube felt.

3. The detector of claim 2, wherein the multiple layers together define a spatially variant transmissivity of the filter.

4. The detector of claim 1, wherein the filter comprises a frame in which the layer is disposed.

5. The detector of claim 4, further comprising multiple frames including the frame, the multiple frames being individually addressable and individually movable relative to the detector cell.

6. The detector of claim 1, defining an aperture substantially parallel with the absorption surface, wherein the detector cell and the filter are configured to accommodate the aperture.

7. The detector of claim 6, wherein the detector comprises segments arranged about the aperture, and wherein the filter comprises one or more filter sections disposed to shield one or more of the segments from the subset of incident particles.

8. The detector of claim 1, further comprising a shield, moveable relative to the detector cell and the filter and disposed such that the filter is between the detector and the shield.

9. The detector of claim 1, further comprising a retaining element, configured to dispose the detector and the filter in a vacuum chamber of a charged particle microscope and to orient the detector relative to a sample stage of the charged particle microscope such that the filter is disposed between the sample stage and the detector.

10. The detector of claim 1, wherein the detector comprises a silicon drift detector.

11. A charged particle beam system, comprising:

a vacuum chamber;

a charged particle beam column, operably coupled with the vacuum chamber and configured to direct a beam of charged particles into the vacuum chamber; a sample stage, disposed in the vacuum chamber; and a detector, comprising:

a detector, configured to generate an electrical signal in response to a particle incident on an active layer of the detector, the active layer defining an absorption surface oriented toward the sample stage; and a filter, comprising a membrane of carbon material comprising carbon nanotubes, the filter being disposed between the sample stage and the detector to shield the absorption surface from a subset of the incident particles, the subset comprising electrons, ions, and photons having an energy less than about 40 eV.

12. The system of claim 11, wherein the carbon material comprises a layer of nonwoven carbon nanotube felt.

13. The system of claim 12, wherein the membrane comprises multiple substantially planar layers of nonwoven carbon nanotube felt.

14. The system of claim 13, wherein the multiple layers together define a spatially variant transmissivity of the filter.

15. The system of claim 11, wherein the charged particle beam column defines a beam axis, A, and wherein the detector defines an aperture substantially parallel with the absorption surface and substantially aligned with the beam axis, wherein the detector and the filter are configured to accommodate the aperture.

16. The system of claim 15, wherein the detector comprises segments arranged about the aperture, and wherein the filter comprises one or more filter sections disposed to shield one or more of the segments from the subset of incident particles.

17. The system of claim 11, further comprising a shield, moveable relative to the detector and the filter and disposed such that the filter is between the detector and the shield with respect to the sample stage.

* * * * *